(12) United States Patent
Yoshioka

(10) Patent No.: US 7,082,046 B2
(45) Date of Patent: Jul. 25, 2006

(54) SEMICONDUCTOR MEMORY DEVICE AND METHOD OF READING DATA

(75) Inventor: Hiroshi Yoshioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/039,938

(22) Filed: Jan. 24, 2005

(65) Prior Publication Data

US 2005/0128849 A1 Jun. 16, 2005

Related U.S. Application Data

(63) Continuation of application No. PCT/JP03/02268, filed on Feb. 27, 2003.

(51) Int. Cl.
*G11C 11/22* (2006.01)

(52) U.S. Cl. .................. 365/145; 365/204; 365/205

(58) Field of Classification Search ............. 365/145, 365/204, 205, 250

See application file for complete search history.

(56) References Cited

U.S. PATENT DOCUMENTS

| 6,031,754 | A * | 2/2000 | Derbenwick et al. ....... 365/145 |
| 6,046,928 | A * | 4/2000 | Takata ..................... 365/145 |
| 6,233,170 | B1 * | 5/2001 | Yamada .................... 365/145 |
| 6,937,499 | B1 * | 8/2005 | Nordal et al. ............... 365/145 |
| 2001/0040814 | A1 | 11/2001 | Takashima | |

FOREIGN PATENT DOCUMENTS

| JP | 2000-285682 | 10/2000 |
| JP | 2001-202776 | 7/2001 |
| JP | 2001-319472 | 11/2001 |

* cited by examiner

*Primary Examiner*—Hoai V. Ho
(74) *Attorney, Agent, or Firm*—Arent Fox PLLC (57) ABSTRACT

A semiconductor memory device is characterized by including a bit line, a transistor coupled to the bit line, a ferroelectric memory cell coupled to the bit line via the transistor, a shift circuit coupled to the bit line to lower a data potential that appears on the bit line in response to data stored in the memory cell, and a sense amplifier coupled to the bit line and to a ground potential to amplify a potential difference between the data potential lowered by the shift circuit and the ground potential.

10 Claims, 8 Drawing Sheets

SEMICONDUCTOR MEMORY DEVICE AND METHOD OF READING DATA

CROSS-REFERENCE TO RELATED APPLICATION

This is a continuation of International Application No. PCT/JP03/02268, filed on Feb. 27, 2003, the entire contents of which are hereby incorporated by reference.

BACKGROUND OF THE INVENTION

1. Field of the Invention

The present invention generally relates to semiconductor memory devices, and particularly relates to a semiconductor memory device which stores data in ferroelectric memory cells.

2. Description of the Related Art

1T1C (one-transistor one-capacitor) ferroelectric memories store one-bit information in a single memory cell. The memory cell stores electric charge in the case of data "1", and does not store electric charge in the case of data. In order to sense the data stored in this memory cell, a reference potential is generated that is larger than "0" data and smaller than "1" data, and the relative magnitudes of the reference potential and the data potential are amplified by a sense amplifier.

For the generation of the reference potential, a reference cell is used that has substantially the same circuit structure as the memory cell, and that has larger size than the memory cell. The electrical characteristics of memory cells using ferroelectrics deteriorate due to repeated polarization reversals or due to the long-term retention of the same data. The reference cell for use in the reference-voltage generation circuit also suffers the degradation of its electrical characteristics.

The way degradation occurs over time differs between the memory cell retaining "1" data and the memory cell retaining "0" data. In general, the reference cell has the same degradation characteristics as the memory cell that retains "0" data. Accordingly, a sense margin required to sense "0" data is constant regardless of the degree of deterioration with time. With respect to "1" data, however, the sense margin decreases as deterioration progresses with time. Moreover, since the frequency of access differs between the memory cell and the reference cell, the deterioration characteristics are not completely the same between the memory cell retaining "0" data and the reference cell.

Because of this, it is difficult to set the reference potential to a proper level by anticipating, at the time of shipping out of ferroelectric memories from the factory, the degradation of the characteristics that will occur in the future.

Accordingly, the present invention is aimed at providing a 1T1C ferroelectric memory that is capable of detecting "0" data and "1" data without using the reference potential generated by a reference cell.

[Patent Document 1] Japanese Patent Application Publication No. 2001-202776

[Patent Document 2] Japanese Patent Application Publication No. 2000-285682

SUMMARY OF THE INVENTION

A semiconductor memory device according to the present invention is characterized by including a bit line, a transistor coupled to the bit line, a ferroelectric memory cell coupled to the bit line via the transistor, a shift circuit coupled to the bit line to lower a data potential that appears on the bit line in response to data stored in the memory cell, and a sense amplifier coupled to the bit line and to a ground potential to amplify a potential difference between the data potential lowered by the shift circuit and the ground potential.

A method of reading data in a semiconductor memory device according to the present invention is characterized by comprising the steps of reading data to a bit line from a ferroelectric memory cell, lower a data potential appearing on the bit line by extracting electric charge from the bit line, and sensing the data by amplifying a potential difference between the lowered data potential and a ground potential.

In the present invention, the shift circuit is provided. The shift circuit performs the operation to lower the potential of the bit line. With this provision, the potential of the bit line coupled to a data "0" memory cell settles at a potential lower than the ground potential. Further, a drop in the bit line potential is set to such a proper amount that the potential of the bit line coupled to a data "1" memory cell settles at a potential higher than the ground potential.

The sense amplifier uses the ground potential as a reference potential to amplify the potential difference between the bit line potential and the reference potential, thereby fixing the read data. Accordingly, the sense amplifier using the ground potential as a reference potential can sense "1" data in the case of a positive potential and "0" data in the case of a negative potential. In this manner, the construction of the present invention provides for "0" data and "1" data to be properly sensed without using a reference voltage generated by a reference cell.

DESCRIPTION OF THE PREFERRED EMBODIMENTS

In the following, embodiments of the present invention will be described with reference to the accompanying drawings.

Figure 1:
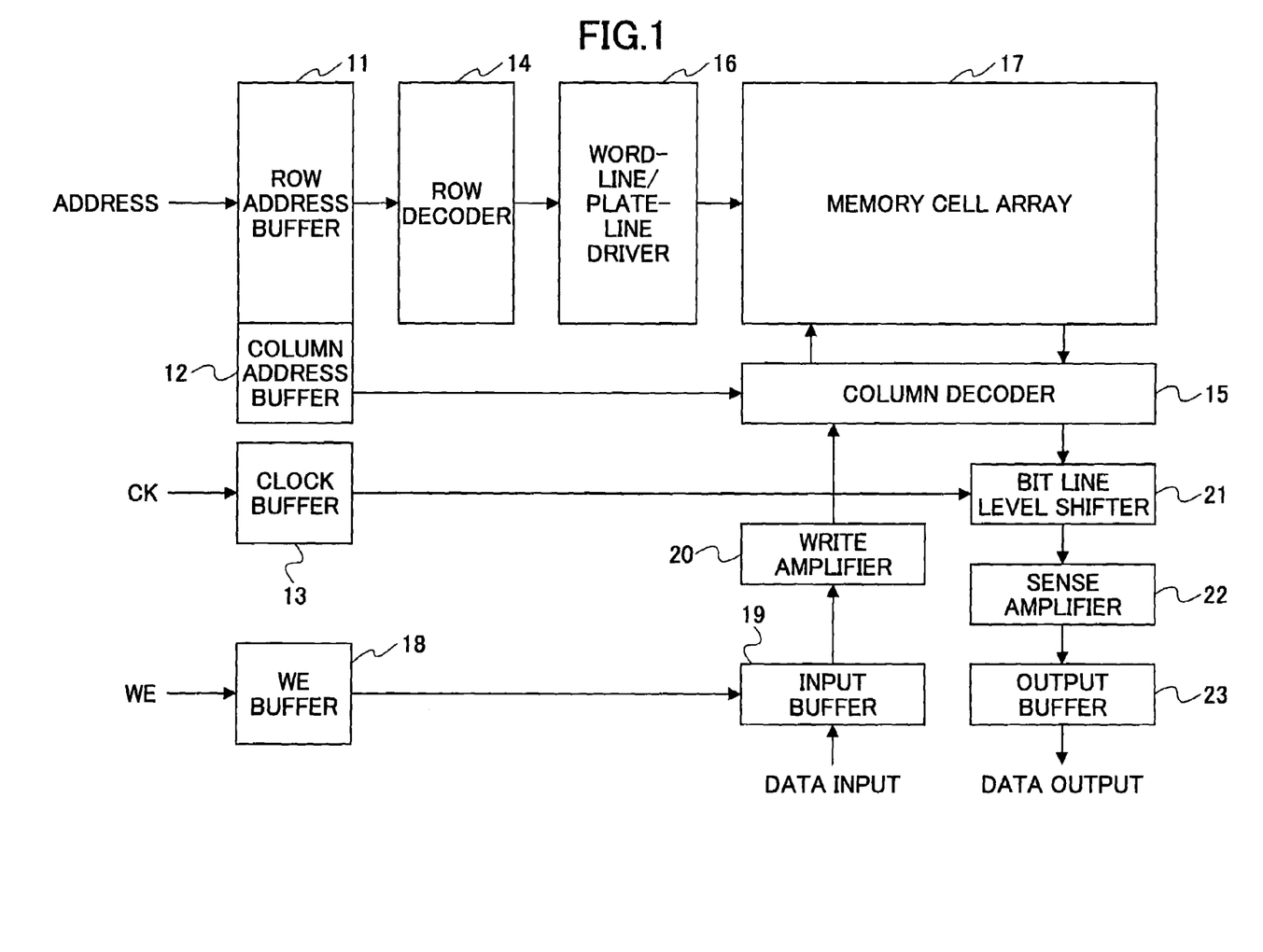
FIG. 1 is a drawing showing an example of the construction of a semiconductor memory device according to the present invention.

FIG. 1 is a drawing showing an example of the construction of a semiconductor memory device according to the present invention.

The semiconductor memory device of FIG. 1 includes a row address buffer 11, a column address buffer 12, a clock buffer 13, a row decoder 14, a column decoder 15, a word-line/plate-line driver 16, a memory cell array 17, a WE buffer 18, an input buffer 19, a write amplifier 20, a bit line level shifter 21, a sense amplifier 22, and an output buffer 23.

The memory cell array 17 includes a plurality of memory cells having ferroelectric material as memory elements arranged in matrix form, with the circuits and wires for transmitting data and specifying addresses for the reading/writing of one-bit data with respect to each memory cell. Each memory cell is coupled to a bit line via a cell transistor that has an on/off state thereof controlled by a word line. The bit line is connected to the sense amplifier 22. The sense amplifier 22 senses the data by amplifying a potential difference between a reference potential and the data potential read from a memory cell to the bit line.

The row address buffer 11 receives a row address signal from an exterior, and supplies the row address to the row decoder 14 at proper timing. The column address buffer 12 receives a column address signal from an exterior, and supplies the column address to the column decoder 15 at proper timing. The timing at which the addresses are supplied is controlled based on the timing signals supplied from the clock buffer 13. The clock buffer 13 receives a clock signal CK from the exterior, and generates various timing signals. Each unit of the semiconductor memory device operates at proper timing responsive to these timing signals.

The input buffer 19 supplies input data written from the exterior to the write amplifier 20 when the WE buffer 18 that receives a write-enable signal WE from the exterior indicates data writing. The write amplifier 20 amplifies the written data for provision to the memory cell array 17. The sense amplifier 22 amplifies data read from the memory cell array 17, thereby sensing the read data. The output buffer 23 outputs the read data to the exterior at proper timing as it is supplied from the sense amplifier 22.

The row decoder 14 decodes the row address supplied from the row address buffer 11, thereby selecting a word line corresponding to the row address from the plurality of word lines. The word-line/plate-line driver 16 selectively activates a word line and plate line corresponding to the selected word. The cell transistors connected to the activated word line are made conductive, so that the writing/reading of data is performed with respect to the memory cells having the selected word address. At this time, the plate line corresponding to the selected word address is also selectively activated.

In ferroelectric memories, data writing is performed by applying a HIGH voltage to one end of the ferroelectric element through a plate line while applying a HIGH or LOW data voltage to the other end of the ferroelectric element. The plate line corresponding to the activated word line is activated together with the word selection by the word line, thereby carrying out data writing with respect to the selected memory cells.

The column decoder 15 decodes the column address supplied from the column address buffer 12, thereby activating a column line corresponding to the column address. As a result, the corresponding column transistors are made conductive, so that access to the memory cells is provided through the corresponding bit lines of the memory cell array 17.

In the case of read operation, data are read to the bit lines from the memory cells coupled to the activated word line, and the sense amplifier 22 senses the data on the bit lines. The read data corresponding to the activated column line is output to the exterior through the output buffer 23. In the case of write operation, data supplied from the exterior to the input buffer 19 are written to the memory cells coupled to the activated word line through the bit lines corresponding to the activated column line. In both the read operation and the write operation, a plate line connected to the memory cells, corresponding to the activated word line, is selectively activated.

In the present invention, the bit line level shifter 21 is provided. The bit line level shifter 21 performs the operation to bring down the potential of the bit lines during the period in which both a word line and a plate line are selectively activated at the time of read operation. With this provision, the potential of the bit lines coupled to the data "0" memory cells settles at a potential lower than the ground potential after the plate line is deactivated. Further, the drop of the bit line potential is set to such a proper amount that the potential of the bit lines coupled to the data "1" memory cells settles at a potential higher than the ground potential after the plate line is deactivated.

The sense amplifier 22 uses the ground potential as a reference potential to amplify the potential difference between the bit line potential and the reference potential, thereby fixing the read data.

Figure 2:
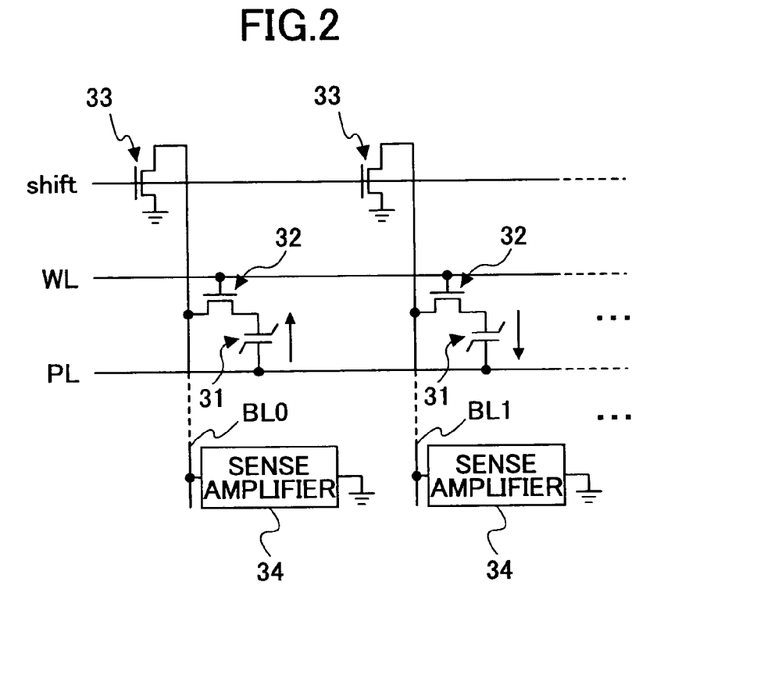
FIG. 2 is a drawing for explaining the read operation of the ferroelectric semiconductor memory device according to the present invention.

FIG. 2 is a drawing for explaining the read operation of the ferroelectric semiconductor memory device according to the present invention. The construction shown in FIG. 2 corresponds to the portion relating to the memory cell array 17, the bit line level shifter 21, and the sense amplifier 22 of FIG. 1.

A word line WL selectively activated in response to a row address is connected to the gate of an NMOS transistor 32. The source node of the NMOS transistor 32 is connected to one end of a ferroelectric memory cell 31, and the drain node is connected to either a bit line BL0 or a bit line BL1. The other end of the memory cell 31 is connected to a plate line PL that is selectively activated together with the word line.

The bit lines BL0 and BL1 are connected to a sense amplifier 34. The sense amplifier 34 is further coupled to the ground that serves as the reference potential (standard potential). The bit lines BL0 and BL1 are coupled to NMOS transistors 33, which lower the bit-line potential level in response to a shift signal shift.

In the conventional Up-Down sensing method, a plate line is changed from LOW (ground potential) to HIGH (power supply potential VDD) and then to LOW again while the memory cells are being accessed through the selective activation of a word line, and resulting levels appearing on the bit lines are sensed. When the plate line is returned to LOW, the potential appearing on the bit lines becomes a positive potential in the case of "1" data, and becomes a ground potential in the case of "0" data.

In the present invention, the shift signal shift is changed to HIGH to make the NMOS transistors 33 conductive while the word line WL is selectively activated and the plate line PL is HIGH. This extracts electric charge from the bit lines BL0 and BL1, thereby bringing down the potential of the bit lines BL0 and BL1. When the plate line PL is thereafter returned to LOW, the potential of the bit lines BL0 and BL1 settles at a positive potential in the case of the data of the memory cell 31 being "1", and settles at a negative potential in the case of the data of the memory cell 31 being "0".

Accordingly, the sense amplifier 34 using the ground potential as a reference potential can sense "1" data in the case of a positive potential and "0" data in the case of a negative potential. In this manner, the present invention does not need to use a reference cell for generating a reference potential.

Figure 3:
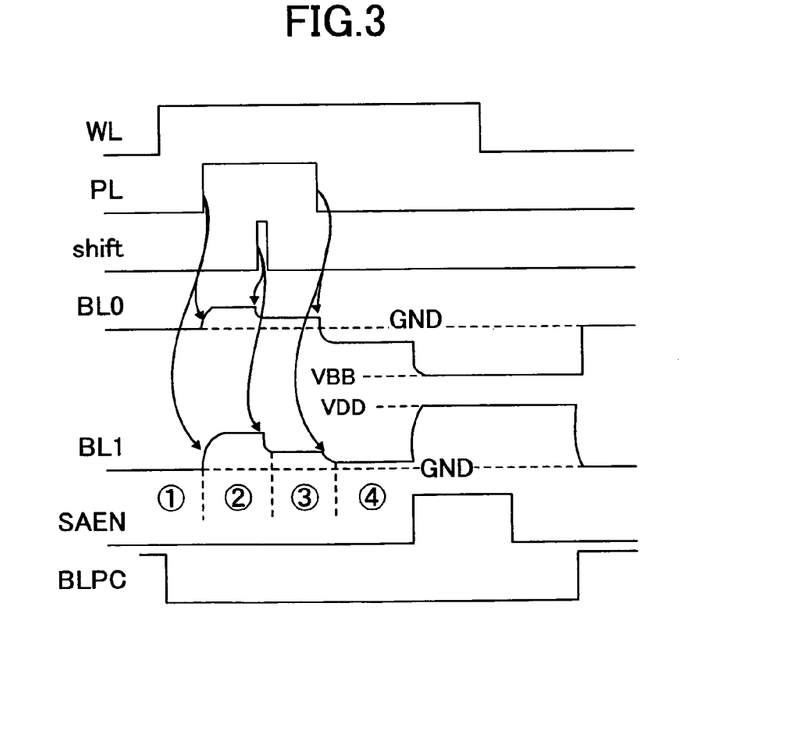
FIG. 3 is a timing chart for explaining the operation of the circuit of FIG. 2.

FIG. 3 is a timing chart for explaining the operation of the circuit of FIG. 2.

First, the word line WL is selectively activated and set to HIGH. Then, the plate line PL is selectively activated to HIGH, resulting in the potentials corresponding to the stored data of the memory cells 31 appearing on the bit lines BL0 and BL1, respectively. In this example, the memory cell 31 connected to the bit line BL0 stores "0" data whereas the memory cell 31 connected to the bit line BL1 stores "1" data.

After this, the shift signal shift is changed to HIGH while the plate line PL is selectively activated. As a result, the electric charge of the bit lines BL0 and BL1 is drained, so that the potential lowers in proportion to the length of the period during which the shift signal shit is HIGH. The plate line PL is then returned to LOW. As a result, the potentials of the bit lines BL0 and BL1 settle at a negative potential and a positive potential, respectively.

After the plate line PL is returned to LOW, a sense amplifier enable signal SAEN for activating the sense amplifier is asserted to drive the sense amplifier 34. As a result, the potential of the bit line BL0 that is a negative potential is amplified to increase a distance from a ground potential GND, becoming a predetermined negative power supply potential VBB. The potential of the bit line BL1 that is a positive potential is amplified to increase a distance from the ground potential GND, becoming a predetermined positive power supply potential VDD.

Figure 4A:
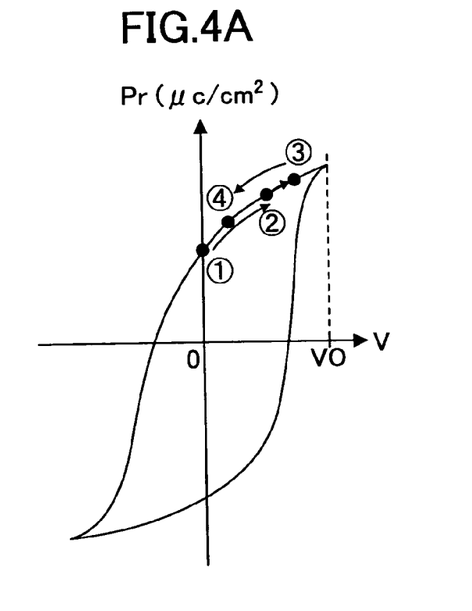
FIG. 4A is a drawing showing changes in the polarization amount of a memory cell in the case of data "0"
Figure 4B:
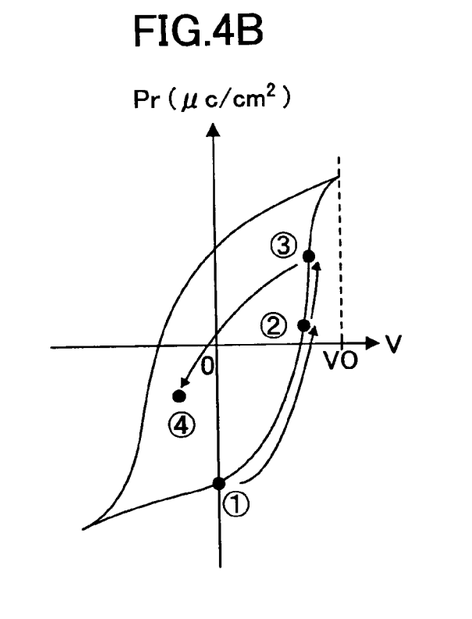
FIG. 4B is a drawing showing changes in the polarization amount of a memory cell in the case of data "1".

FIG. 4A shows changes in the polarization amount of a memory cell in the case of data "0", and FIG. 4B shows changes in the polarization amount of a memory cell in the case of data "1".

States ① through ④ shown in FIGS. 4A and 4B correspond to periods ① through ④ shown in FIG. 3. The horizontal axis V represents a voltage that is applied to the plate line PL, and the vertical axis Pr represents the amount of polarization of the memory cell. Illustrated curves represent the hysteresis characteristics of the memory cell. In the case of the stored data being "0", the state of the memory cell is positioned on the hysteresis curve on the upper side. In the case of the stored data being "1", the state of the memory cell is positioned on the hysteresis curve on the lower side.

When the potential of the plate line PL is zero, the memory cell is placed in the state ①. As the plate line potential is changed to HIGH, the memory cell moves to the state ②. At this time, the potential appearing on the bit line is the difference between a voltage VO corresponding to the right end of the hysteresis curve and the horizontal-axis position of the state ② of the memory cell. Electric charge is then extracted from the bit line, resulting in a drop in the bit line potential, accompanied by the shift of the memory cell to the state ③. At this time, the potential appearing on the bit line is a difference between the voltage VO and the horizontal-axis position of the state ③ of the memory cell. As the potential of the plate line PL is returned to zero, the memory cell moves to the state ④. At this time, the potential appearing on the bit line is the difference between the horizontal-axis position of the origin O and the horizontal-axis position of the state ④ of the memory cell.

Accordingly, the potential of the bit line is set to a negative level in the case of data "0" shown in FIG. 4A. In the case of data "1" shown in FIG. 4B, the potential of the bit line is set to a positive level (the direction toward the negative potential of the plate line corresponds to the direction toward the positive potential of the bit line).

In the state ④ in which the potential of the bit line is either positive or negative according to the stored data, the sense amplifier 34 shown in FIG. 2 amplifies a difference between the bit line and the ground line to sense the data.

Figure 5:
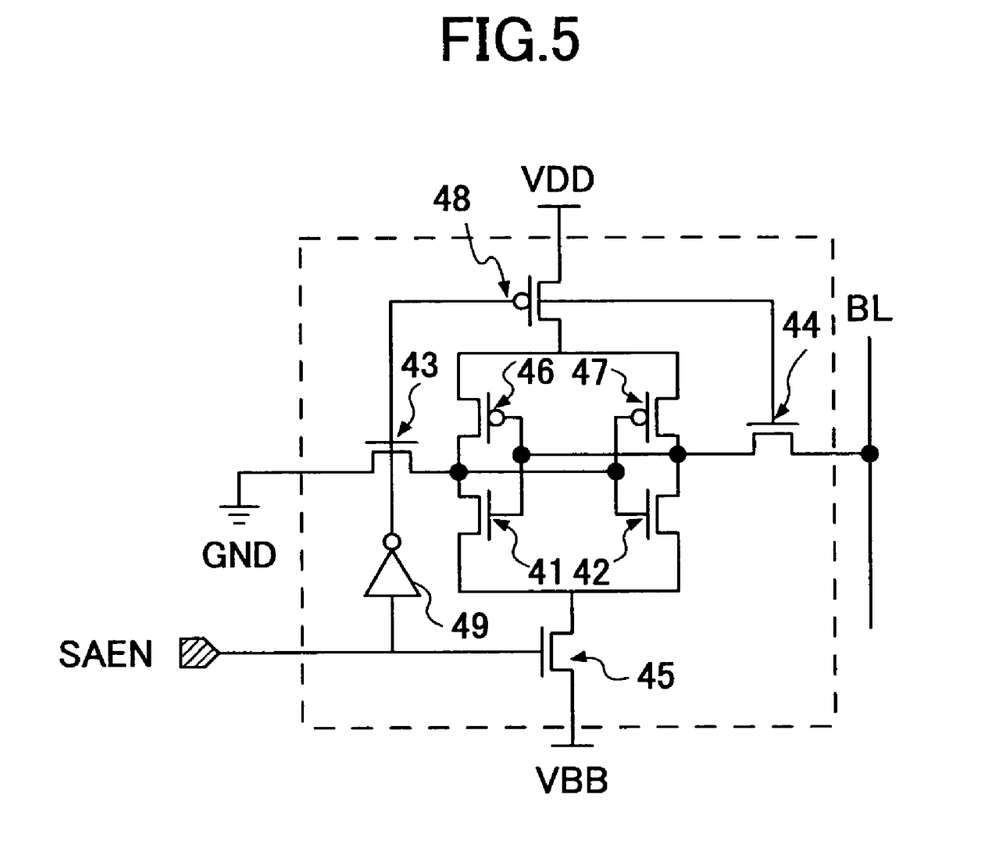
FIG. 5 is a drawing showing an example of the circuit construction of the sense amplifier used in the present invention.

FIG. 5 is a drawing showing an example of the circuit construction of the sense amplifier 34 used in the present invention. The sense amplifier 34 used in the present invention needs to have such a configuration as to detect not only a positive potential but also a negative potential without difficulty because the potential to be sensed assumes either a positive level or a negative level.

The sense amplifier 34 of FIG. 5 includes NMOS transistors 41 through 45, PMOS transistors 46 through 48, and an inverter 49. The sense amplifier 34 has a construction similar to that of an ordinary sense amplifier, but uses the positive power supply potential VDD and the negative power supply potential VBB as drive potentials. The negative power supply potential VBB may be generated by a step-down-voltage generation circuit which generates a stepped-down voltage by the pumping operations of capacitive coupling.

As the sense amplifier enable signal SAEN changes to HIGH, the NMOS transistor 45 and the PMOS transistor 48 become conductive, resulting in the activation of the sense amplifier. The difference between the bit line BL and the ground potential is thus amplified.

Figure 6:
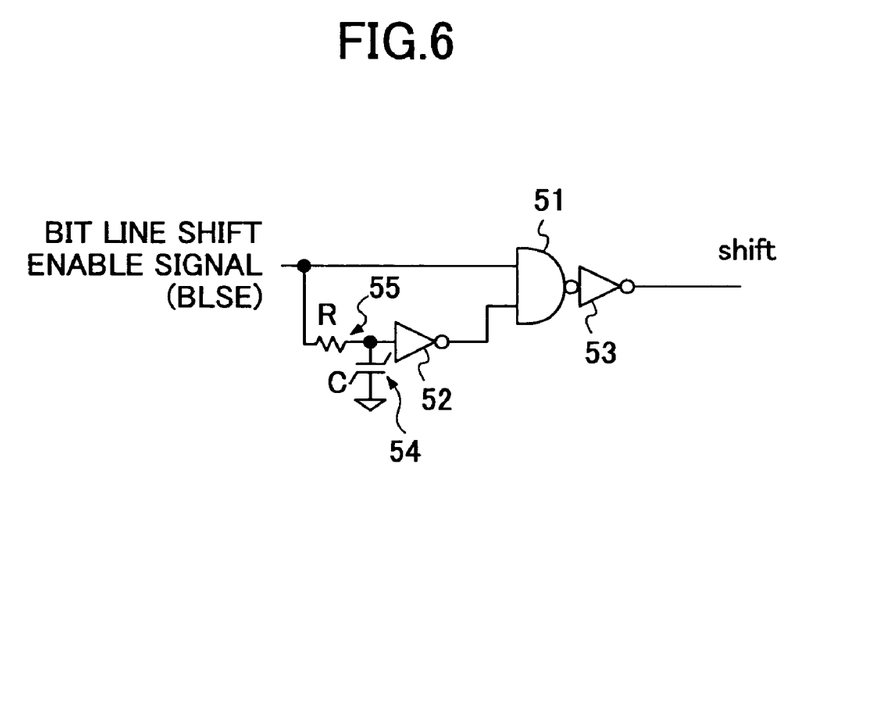
FIG. 6 is a drawing showing an example of the circuit construction for generating the shift signal that lowers the potential of bit lines.

FIG. 6 is a drawing showing an example of the circuit construction for generating the shift signal shift that lowers the potential of bit lines.

The shift signal generating circuit of FIG. 6 includes a NAND gate 51, inverters 52 and 53, a ferroelectric memory cell 54, and a resistor 55. The memory cell 54 is a device having the same construction as the memory cells of the memory cell array 17 for storing data. The capacitance of the memory cell 54 is C, and the resistance of the resistor 55 is R.

As a bit line shift enable signal BLSE is set to HIGH, both inputs into the NAND gate 51 become HIGH, resulting in the shift signal shift being HIGH. Then, the input into the inverter 52 becomes HIGH after a delay equal to a time constant $\tau_{CR}$ that is defined by the resistance R and the capacitance C. In response, the output of the inverter 52 becomes LOW, resulting in the shift signal shift being changed to LOW.

Figure 7:
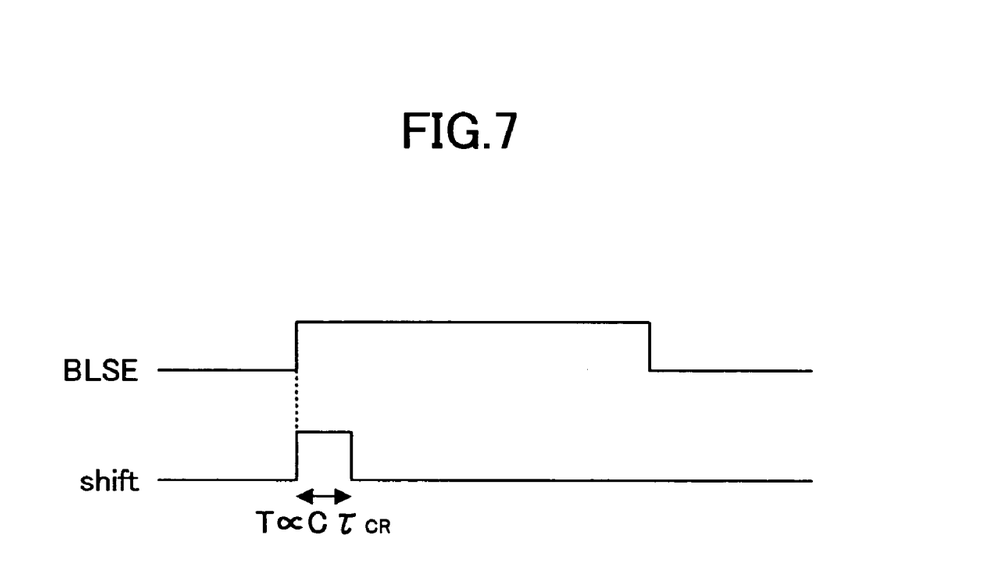
FIG. 7 is a drawing showing the relationship between the bit line shift enable signal BLSE and the shift signal shift.

FIG. 7 is a drawing showing the relationship between the bit line shift enable signal BLSE and the shift signal shift.

As shown in FIG. 7, the shift signal shift becomes HIGH for a duration T following the change to HIGH in the bit line shift enable signal BLSE. Here, the duration T is proportional to the time constant $\tau_{CR}$.

Figure 8:
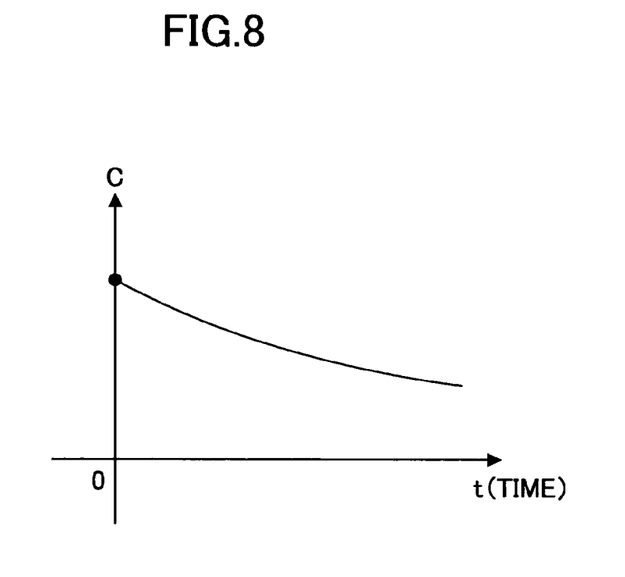
FIG. 8 is a drawing showing the change of the memory cell over time.

FIG. 8 is a drawing showing the change of the memory cell 54 over time. The memory cell 54 suffers degradation in its electrical characteristics due to the long-term retention of the same data, so that the capacitance C of the memory cell 54 decreases with time t as shown in FIG. 8. In response, the time constant $\tau_{CR}$ defined by the resistance R and the capacitance C also decreases.

Figure 9:
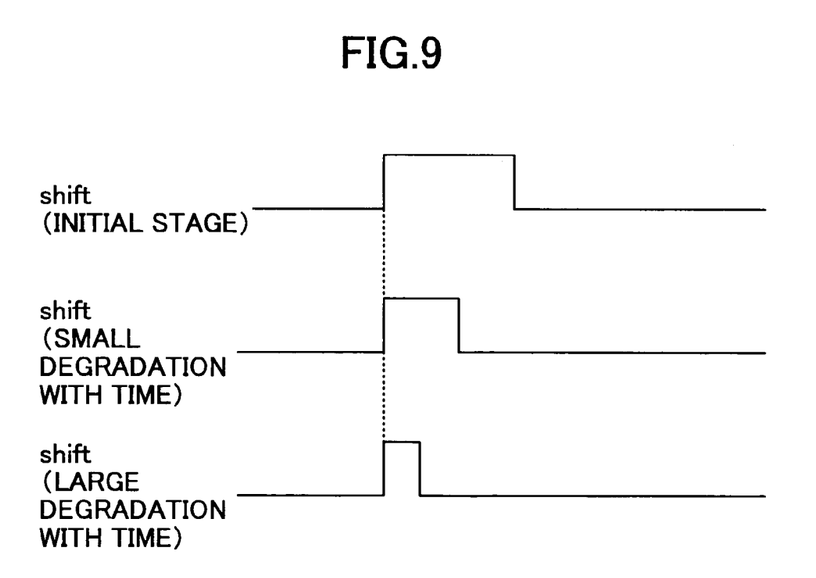
FIG. 9 is a drawing showing a change over time in the pulse width of the shift signal generated by the shift signal generating circuit of FIG. 6.

FIG. 9 is a drawing showing a change over time in the pulse width of the shift signal generated by the shift signal generating circuit of FIG. 6.

When the capacitance C of the memory cell 54 drops with time as shown in FIG. 8, and the time constant $\tau_{CR}$ defined by the resistance R and the capacitance C decreases in response, the shift signal shift generated by the shift signal generating circuit experiences a gradual decrease in its pulse width as shown in FIG. 9. Provision is thus made to reduce the amount of a potential drop in the bit line potentials to keep in line with the degradation over time of the memory cells 31 (FIG. 2) of the memory cell array 17 (FIG. 1).

Figure 10:
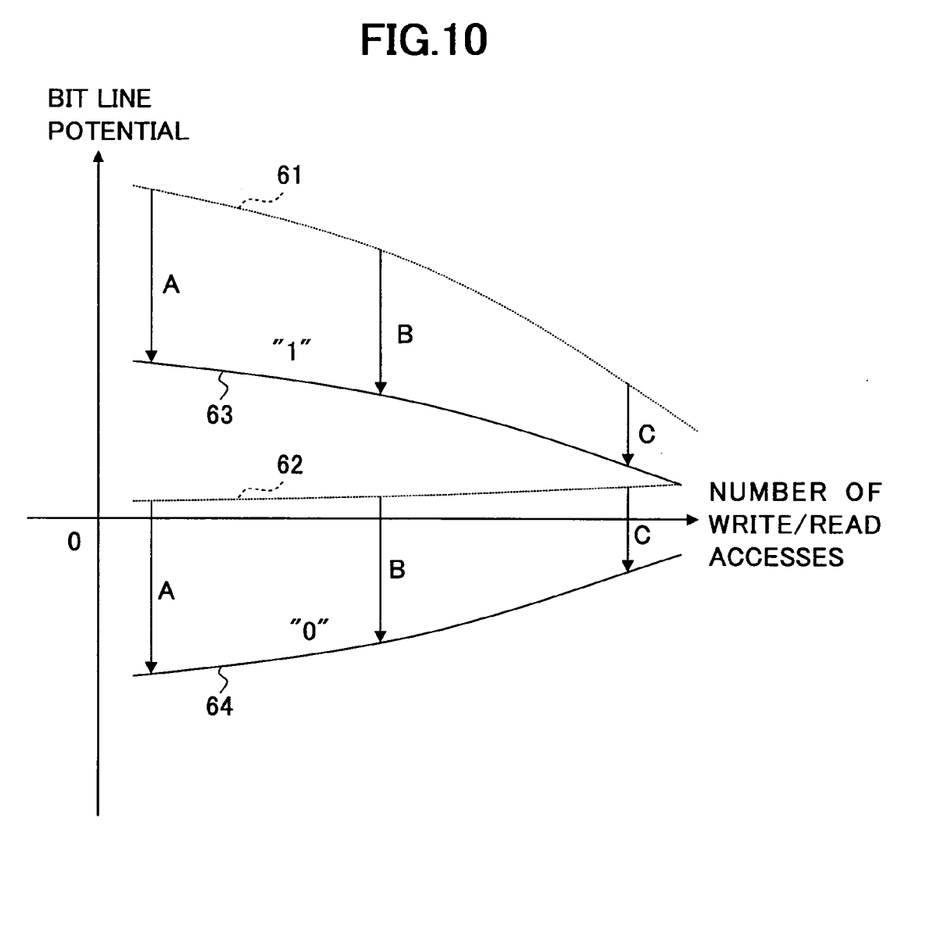
FIG. 10 is a drawing showing a change with time in the bit line potential when the shift signal generating circuit of FIG. 6 is employed.

FIG. 10 is a drawing showing a change with time in the bit line potential when the shift signal generating circuit of FIG. 6 is employed.

In FIG. 10, the horizontal axis represents the number of write/read accesses with respect to a memory cell, and the vertical axis represents a bit line potential both in the case of data "0" and in the case of data "1". A dotted line 61 illustrates a potential read to the bit line in the case of data "1", and a solid line 63 shows the bit line potential after the extraction of electric charge by the shift signal shift following the reading of the potential of data "1". A dotted line 62 illustrates a potential read to the bit line in the case of data "0", and a solid line 64 shows the bit line potential after the extraction of electric charge by the shift signal shift following the reading of the potential of data "0".

After the lowering of the potential by the shift signal shift, a midpoint potential between a data "1" potential 63 and a data "0" potential 64 is preferably set to the ground potential that serves as the reference potential. This is because placing the ground potential at the midpoint achieves reliable data read operation with maximum margins.

As shown by the dotted lines 61 and 62 in FIG. 10, as the number of read/write accesses increases, the potential of data "1" gradually drops whereas the potential of data "0" gradually rises. The slope at which the potential of data "1" drops is steeper than the slope at which the potential of data "0" rises. If the shift amount in the potential brought down by the shift signal shift is fixed, therefore, the midpoint between the data "1" potential and data "0" potential lowered by the shift signal shift will gradually drop with time.

On the other hand, if the shift amount is gradually reduced from A, B, to C as shown in FIG. 10, the midpoint between the data "1" potential 63 and data "0" potential 64 lowered by the shift signal shift will be placed around the ground potential (potential 0) regardless of the changes over time.

The use of the shift signal generating circuit as shown in FIG. 6 provides for the pulse width of the shift signal shift to exhibit a gradual decrease with time as shown in FIG. 9, resulting in the drop of the bit line potential of the memory cell array 17 being decreased. With this provision, it is possible to position the midpoint between the data "1" potential and the data "0" potential around the ground potential (potential 0) regardless of the changes with time. This achieves reliable data reading with sufficient margins.

In the construction of FIG. 6, the capacitance C is implemented by use of the memory cell 54. Alternatively, the capacitance C may be implemented by use of an ordinary capacitor. In this case, the pulse width of the shift signal shift is fixed, and the shift of the bit line potential stays constant despite the passage of time. The margins are thus smaller compared to the situations shown in FIG. 10. However, if the pulse width of the shift signal shift is properly set by anticipating the changes of the data potential with time, it is possible to maintain the condition required for proper data reading for a long time.

The construction for changing the pulse width of the shift signal is not limited to the construction that achieves such change by utilizing the change of the memory cell 54 with time as shown in FIG. 6. For example, the pulse width may be adjusted according to the value set in a register, and the register value is adjusted properly as such a need arises. In this manner, various circuit implementations are possible.

Figure 11:
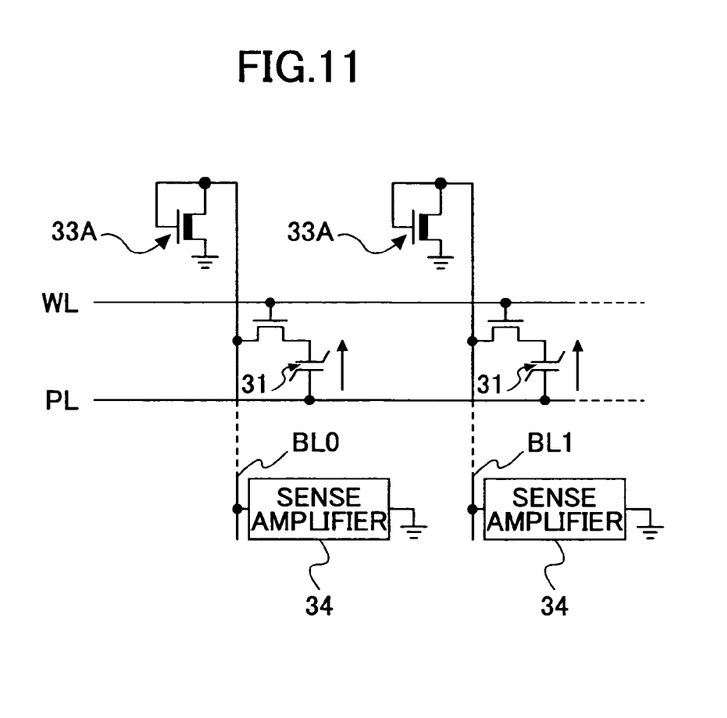
FIG. 11 is a drawing for explaining another embodiment of a read operation of the ferroelectric semiconductor memory device according to the present invention.

FIG. 11 is a drawing for explaining another embodiment of a read operation of the ferroelectric semiconductor memory device according to the present invention. The construction shown in FIG. 11 differs from the construction shown in FIG. 2 in that the NMOS transistors 33 are replaced by depletion-type transistors 33A. The gates of the transistors 33A are connected to the bit lines, forming a diode connection.

While the word line WL is selectively activated and the plate line PL is HIGH, the potential of the bit lines increases from zero to become a positive potential. In response, the transistors 33A become conductive, thereby extracting the electric charge. Because of this, after the plate line PL is returned to the ground level GND, the potential of the bit lines BL0 and BL1 settles at a positive potential in the case of data "1" and at a negative potential in the case of data "0".

Accordingly, the sense amplifier 34 using the ground potential as a reference potential can sense "1" data in the case of a positive potential and "0" data in the case of a negative potential. In this manner, the construction of this embodiment does not need to use the shift signal shift, thereby eliminating a need for the circuit for generating the shift signal.

Figure 12:
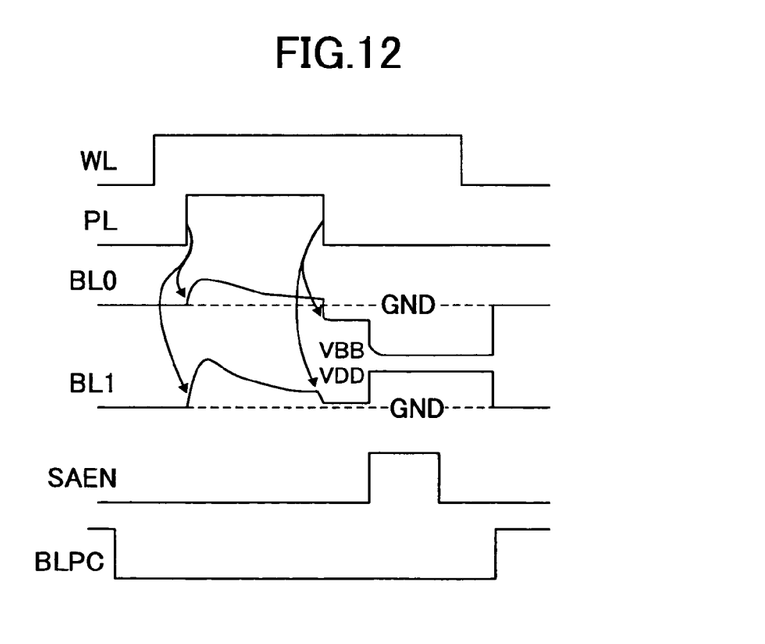
FIG. 12 is a timing chart for explaining the operation of the circuit of FIG. 11.

FIG. 12 is a timing chart for explaining the operation of the circuit of FIG. 11.

First, the word line WL is selectively activated and set to HIGH. Then, the plate line PL is selectively activated to HIGH, resulting in the potentials corresponding to the stored data of the memory cells 31 appearing on the bit lines BL0 and BL1, respectively. In this example, the memory cell 31 connected to the bit line BL0 stores "0" data whereas the memory cell 31 connected to the bit line BL1 stores "1" data.

As the data potentials appear on the bit lines BL0 and BL1, the transistors 33A become conductive, resulting in the electric charge being extracted from the bit lines BL0 and BL1, which thus have lowered potentials. When the plate line PL is returned to LOW thereafter, the potentials of the bit lines BL0 and BL1 settle at a negative potential and a positive potential, respectively.

After the plate line PL is returned to LOW, the sense amplifier enable signal SAEN for activating the sense amplifier is asserted to drive the sense amplifier 34. As a result, the potential of the bit line BL0 that is a negative potential is amplified to increase a distance from a ground potential GND, becoming the predetermined negative power supply potential VBB. The potential of the bit line BL1 that is a positive potential is amplified to increase a distance from the ground potential GND, becoming the predetermined positive power supply potential VDD.

Although the present invention has been described with reference to embodiments, the present invention is not limited to these embodiments. Various variations and modifications may be made without departing from the scope of the claimed invention.

What is claimed is:

1. A semiconductor memory device, characterized by comprising:

a bit line;

a transistor coupled to said bit line;

a ferroelectric memory cell coupled to said bit line via said transistor;

a shift circuit coupled to said bit line to lower a data potential that appears on said bit line in response to data stored in said memory cell; and a sense amplifier coupled to said bit line and to a ground potential to amplify a potential difference between the data potential lowered by said shift circuit and the ground potential.

2. The semiconductor memory device as claimed in claim 1, characterized in that said shift circuit is an NMOS transistor that becomes conductive to couple said bit line to the ground potential, and a shift signal generating circuit is further provided to generate a shift signal applied to a gate of said NMOS transistor.

3. The semiconductor memory device as claimed in claim 2, characterized in that said shift signal generating circuit is configured to be capable of adjusting a pulse width of the shift signal.

4. The semiconductor memory device as claimed in claim 3, characterized in that said shift signal generating circuit changes the pulse width of the shift signal over time.

5. The semiconductor memory device as claimed in claim 4, characterized in that said shift signal generating circuit changes the pulse width of the shift signal over time by a change with time in capacitance of a ferroelectric memory cell.

6. The semiconductor memory device as claimed in claim 1, characterized in that said shift circuit is a depletion-type transistor that becomes conductive to couple said bit line to the ground potential, and a gate of said depletion-type transistor is coupled to said bit line.

7. The semiconductor memory device as claimed in claim 1, further comprising a plate line coupled to said memory cell, characterized in that said shift circuit couples said bit line to the ground potential while the plate line is activated.

8. The semiconductor memory device as claimed in claim 1, characterized in that the data potential lowered by said shift circuit is higher than the ground potential in a case of the data stored in said memory cell being 1, and is lower than the ground potential in a case of the data stored in said memory cell being 0.

9. The semiconductor memory device as claimed in claim 1, characterized in that said sense amplifier is driven based on a positive power supply potential and a negative power supply potential.

10. A method of reading data in a semiconductor memory device, characterized by comprising the steps of:

reading data to a bit line from a ferroelectric memory cell;

lower a data potential appearing on the bit line by extracting electric charge from the bit line; and sensing the data by amplifying a potential difference between the lowered data potential and a ground potential.

* * * * *